(12) United States Patent
Hattori et al.

(10) Patent No.: US 9,119,302 B2
(45) Date of Patent: Aug. 25, 2015

(54) FLEXIBLE CIRCUIT BOARD

(71) Applicant: CANON COMPONENTS, INC., Kodama-gun, Saitama (JP)

(72) Inventors: Yoshihiro Hattori, Saitama (JP); Shozo Asai, Saitama (JP)

(73) Assignee: CANON COMPONENTS, INC. (JP)

( * ) Notice: Subject to any disclaimer, the term of this patent is extended or adjusted under 35 U.S.C. 154(b) by 41 days.

(21) Appl. No.: 13/781,863

(22) Filed: Mar. 1, 2013

(65) Prior Publication Data

US 2013/0228363 A1    Sep. 5, 2013

(30) Foreign Application Priority Data

Mar. 2, 2012 (JP) ................................. 2012-046914
Dec. 25, 2012 (JP) ................................. 2012-281408

(51) Int. Cl.
| H05K 1/00 | (2006.01) |
| H05K 1/02 | (2006.01) |
| H05K 3/40 | (2006.01) |
| H05K 1/03 | (2006.01) |

(52) U.S. Cl.
CPC ............ *H05K 1/0277* (2013.01); *H05K 3/4092* (2013.01); *H05K 1/0393* (2013.01); *H05K 2203/1545* (2013.01)

(58) Field of Classification Search
CPC ....... H05K 1/0393; H05K 3/28; H05K 3/281; H05K 1/056
USPC .................. 174/250, 252, 254, 259; 349/150; 361/749–751
See application file for complete search history.

(56) References Cited

U.S. PATENT DOCUMENTS

| 4,491,622 | A | * | 1/1985 | Butt ............................... 428/632 |
| 5,266,746 | A | * | 11/1993 | Nishihara et al. ............. 174/254 |
| 5,288,950 | A | * | 2/1994 | Ushio et al. .................... 174/254 |
| 6,104,464 | A | * | 8/2000 | Adachi et al. .................. 349/150 |
| 2003/0042042 | A1 | * | 3/2003 | Jo et al. .......................... 174/254 |
| 2004/0016565 | A1 | | 1/2004 | Gallant et al. |
| 2006/0078732 | A1 | | 4/2006 | Gallant et al. |
| 2007/0267299 | A1 | * | 11/2007 | Mitani .......................... 205/222 |
| 2008/0283408 | A1 | | 11/2008 | Nishizawa |
| 2010/0244243 | A1 | | 9/2010 | Eya |

(Continued)

FOREIGN PATENT DOCUMENTS

| CN | 1382009 A | 11/2002 |
| CN | 1863448 A | 11/2006 |

(Continued)

OTHER PUBLICATIONS

Office Action issued in corresponding Japanese Patent Application No. 2012-281408 dated May 28, 2013.

(Continued)

*Primary Examiner* — Timothy Thompson
*Assistant Examiner* — Sherman Ng
(74) *Attorney, Agent, or Firm* — Rossi, Kimms & McDowell LLP

(57) ABSTRACT

A flexible circuit board includes a base film formed by a metallic material, a first protective film formed on a first surface of the base film, and a circuit pattern adhered to the first protective film through an adhesive film. Projections and recesses for heat release are formed on a second surface that is a surface on the opposite side of the first surface of the base film.

19 Claims, 12 Drawing Sheets

(56) References Cited

U.S. PATENT DOCUMENTS

2010/0304614 A1* 12/2010 Matsuo et al. ............... 439/629
2010/0307797 A1* 12/2010 Watanabe ..................... 174/254
2013/0228363 A1     9/2013 Hattori et al.

FOREIGN PATENT DOCUMENTS

| CN | 201869434 U | 6/2011 |
|---|---|---|
| JP | 05-075219 A | 3/1993 |
| JP | 2004-512660 A | 4/2004 |
| JP | 2006-24906 A | 1/2006 |
| JP | 2010-225943 A | 10/2010 |
| JP | 2011-199090 A | 10/2011 |
| JP | 2014-13940 A | 1/2014 |
| WO | 02/35672 A2 | 5/2002 |

OTHER PUBLICATIONS

Chinese Office Action issued in Chinese counterpart application No. CN201310065324.9, dated May 25, 2015. English translation provided.

Japanese Office Action issued in Japanese counterpart application No. JP2014-225444, dated Jun. 30, 2015.

* cited by examiner

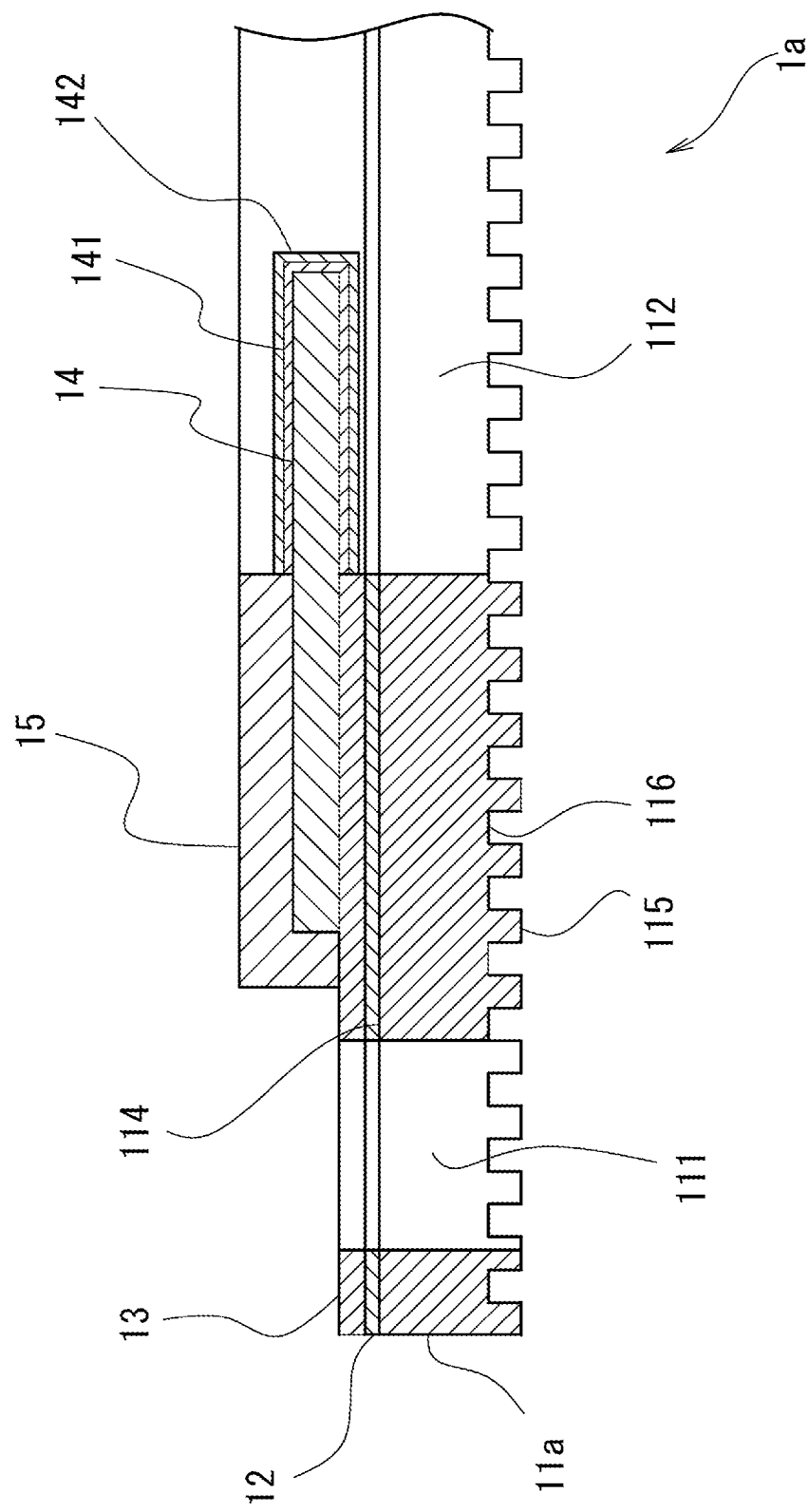

FLEXIBLE CIRCUIT BOARD

CROSS-REFERENCE TO RELATED APPLICATIONS

This application is based upon and claims the benefit of priority of the prior Japanese Patent Application No. 2012-046914, filed on Mar. 2, 2012, and the Japanese Patent Application No. 2012-281408, filed on Dec. 25, 2012, the entire contents of which are incorporated herein by reference.

BACKGROUND OF THE INVENTION

1. Field of the Invention

The present invention relates to a flexible circuit board. More particularly, the present invention relates to a flexible circuit board including a circuit pattern formed on a surface of metal foil through an insulating layer.

2. Description of the Related Art

A conventionally known flexible circuit board (FPC) includes a circuit pattern made of conductive foil attached to a surface of a metallic base film by an adhesive (see Patent Document 1). According to the configuration described in Patent Document 1, the heat of an element and the like mounted on the flexible circuit board is released through a metallic base film, because the thermal conductivity of a metallic material is generally higher than that of a resin composition. Therefore, an effect of heat release can be increased.

The flexible circuit board has a problem that high harmonic components of a digital signal flowing through the circuit pattern may be emitted as noise, and this may affect other electronic devices. To solve such a problem, there is a known configuration in which a shield member, such as metal foil and conductive paste, is arranged to cover the circuit pattern through an insulating material, such as a plastic film and an adhesive (see Patent Document 2). According to the configuration, unnecessary radiation (EMI) from the circuit pattern can be reduced.

[Patent Document 1] Japanese Laid-open Patent Publication No. 2011-199090

[Patent Document 2] Japanese Laid-open Patent Publication No. 05-75219

The amount of heat release of the flexible circuit board depends on an exposed surface area of the metal foil or the metallic base film when the heat is released into the atmosphere. In the conventional configurations, the surfaces of the metal foil and the metallic base film are flat, and there is a problem that an effect of heat release is low. An example of a configuration for increasing the effect of heat release includes a configuration in which a radiator plate, a radiator fin, or the like is attached to the flexible circuit board. However, the number of components and the assembly time increase according to the configuration, and this increases the cost of product and the manufacturing cost.

SUMMARY OF THE INVENTION

In view of the circumstances, an object of the present invention is to provide a flexible circuit board that can release heat of a circuit pattern, a mounted element, and the like without increasing the number of components or the assembly time and that can prevent unnecessary radiation.

To solve the problems, the present invention includes: a base film comprising a metallic material; a first protective film made of an electrically insulating material and formed on one of the surfaces of the base film; and a circuit pattern arranged on a surface of the first protective film, wherein projections and recesses are formed on the one of the surfaces and on the other surface on the opposite side of the base film.

An electrically insulating oxide film may be further formed on the surface of the base film, the first protective film may be formed on a surface of the oxide film, and the oxide film and the first protective film may exist between the circuit pattern and the base film.

The metallic material may be made of aluminum, and the oxide film may be formed by alumite treatment.

The circuit pattern may be adhered by an adhesive film made of an insulating material laminated on the surface of the first protective film.

The first protective film may be formed by polyimide.

The present invention includes: a base film formed by a metallic material; a first protective film made of an electrically insulating material and formed on one of the surfaces of the base film; and a circuit pattern formed on a surface of the protective film, wherein a locking piece that is elastically deformable and that protrudes toward the other surface on the opposite side of the one of the surfaces is arranged on the base film.

The locking piece may be integrated with the base film.

An electrically insulating oxide film may be further formed on the surface of the base film, the first protective film may be formed on a surface of the oxide film, and the oxide film and the first protective film may exist between the circuit pattern and the base film.

The metallic material may be made of aluminum, and the oxide film may be formed by alumite treatment.

The circuit pattern may be adhered by an adhesive film made of an insulating material laminated on the surface of the first protective film.

The first protective film may be formed by polyimide.

The present invention includes: a base film formed by a metallic material; a first protective film made of an electrically insulating material and formed on one of the surfaces of the base film; and a circuit pattern formed on a surface of the protective film, wherein a locking piece that is elastically deformable and that protrudes toward the other surface on the opposite side of the one of the surfaces is arranged on the base film, and projections and recesses are formed on the other surface.

The locking piece may be integrated with the base film.

The projections and recesses may be formed by the metallic material.

An electrically insulating oxide film may be further formed on the surface of the base film, the first protective film may be formed on a surface of the oxide film, and the oxide film and the first protective film may exist between the circuit pattern and the base film.

The metallic material may be made of aluminum, and the oxide film may be formed by alumite treatment.

The circuit pattern may be adhered by an adhesive film made of an insulating material laminated on the surface of the first protective film.

The first protective film may be formed by polyimide.

BRIEF DESCRIPTION OF THE DRAWINGS

FIG. 3 is a sectional view schematically illustrating a configuration of the flexible circuit board according to the first embodiment of the present invention;

DETAILED DESCRIPTION OF THE PREFERRED EMBODIMENTS

Embodiments of the present invention will now be described in detail with reference to the drawings.

First Embodiment

Figure 1:
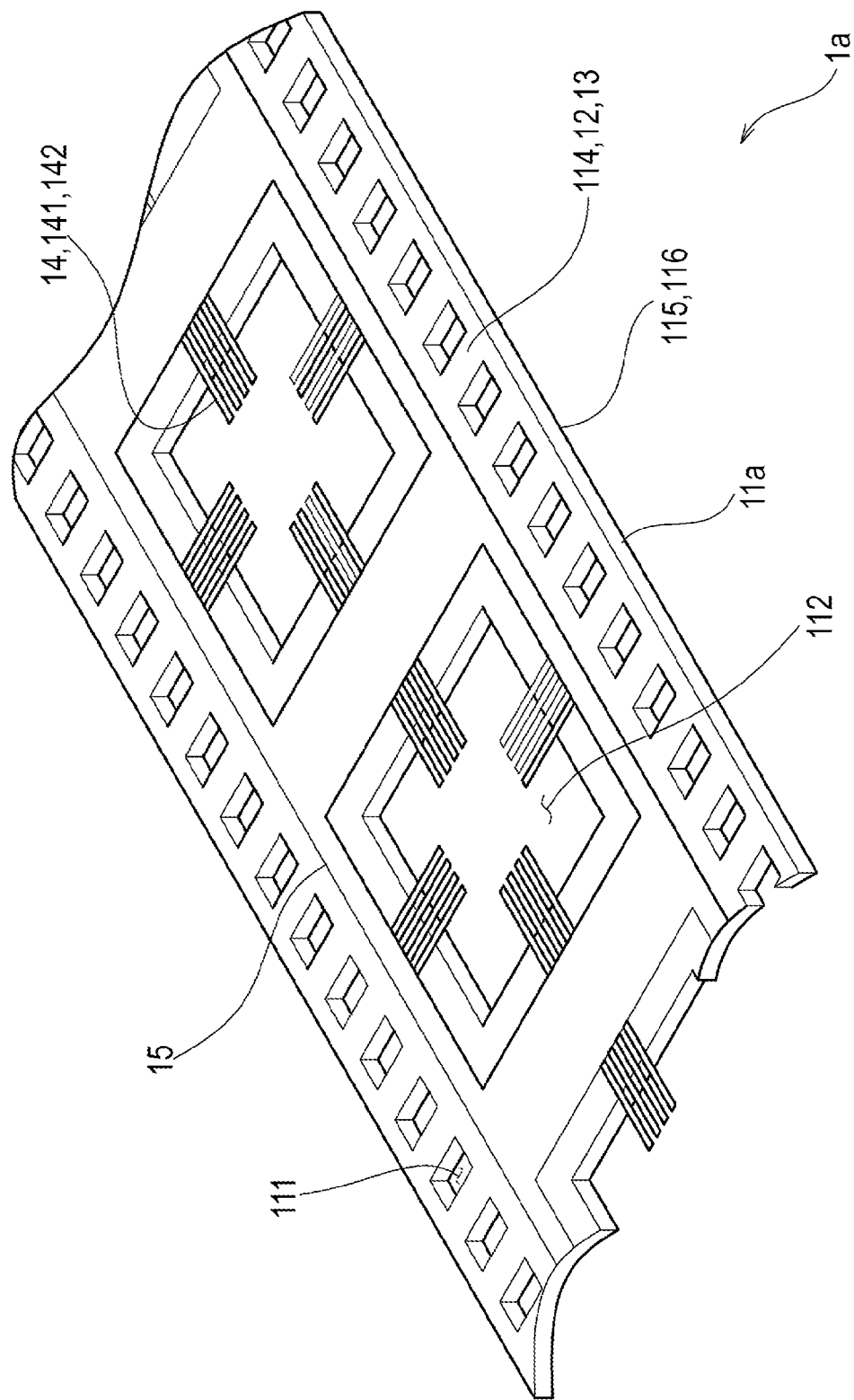
FIG. 1 is a perspective view schematically illustrating an overall configuration of a flexible circuit board according to a first embodiment of the present invention.
Figure 2:
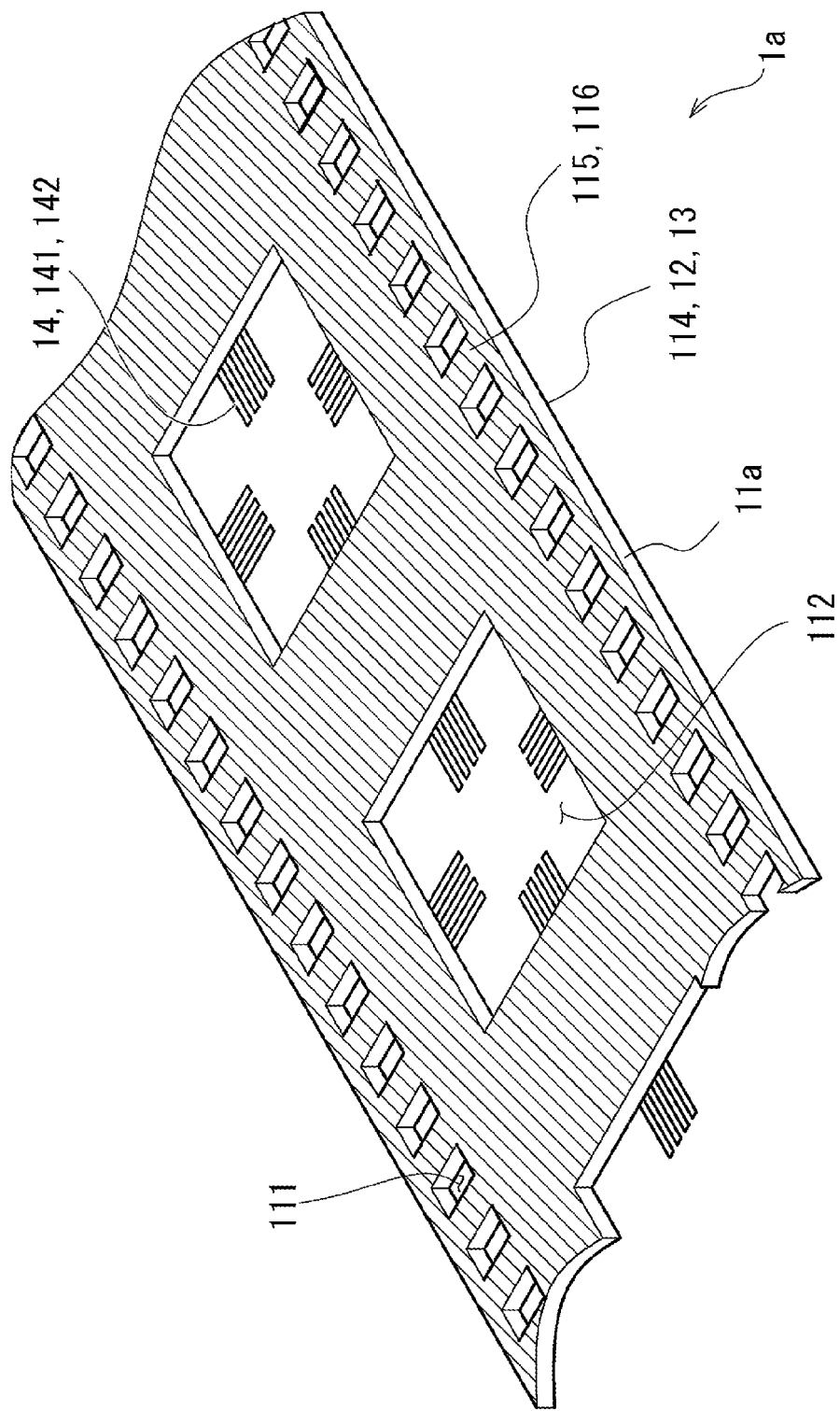
FIG. 2 is a perspective view schematically illustrating the overall configuration of the flexible circuit board according to the first embodiment of the present invention and is a view illustrating a surface on the opposite side from FIG. 1.

FIGS. 1 and 2 will be described in relation to a configuration of a flexible circuit board 1a according to a first embodiment. FIGS. 1 and 2 are perspective views schematically illustrating an overall configuration of the flexible circuit board 1a according to the first embodiment of the present invention. FIGS. 1 and 2 illustrate surfaces on opposite sides. FIG. 3 is a sectional view schematically illustrating a configuration of the flexible circuit board 1a according to the first embodiment of the present invention.

As illustrated in FIGS. 1 to 3, the flexible circuit board 1a includes a base film 11a, a first protective film 12, an adhesive film 13, a circuit pattern 14, and a second protective film 15.

Figure 12:
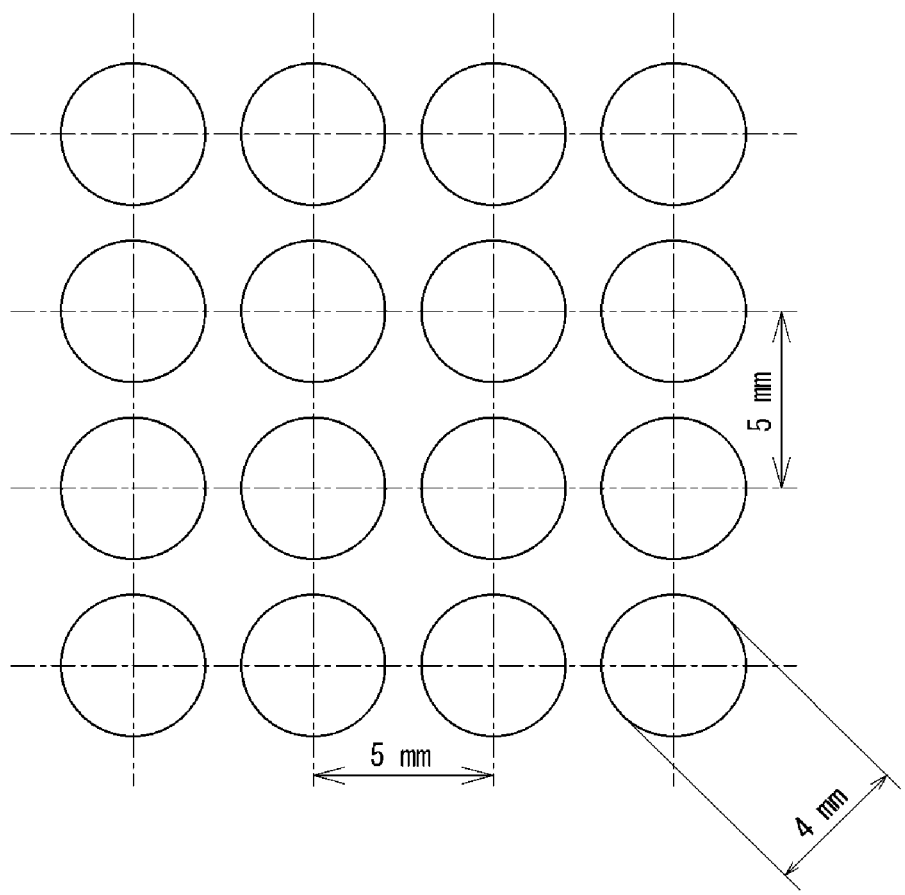
FIG. 12 schematically shows the projections and recesses having a polka dot pattern.

The base film 11a is a flexible film formed by a metallic material. For example, aluminum foil with a thickness of 200 to 400 μm is applied as the base film 11a. The first protective film 12 is formed (described later) on one of the surfaces of the base film 11a (upper surface in FIG. 3, which will be called a "first surface 114" for the convenience of the description). Projections and recesses 116 are formed on the other surface on the opposite side of the one of the surfaces (lower surface in FIG. 3, which will be called a "second surface 115" for the convenience of the description). The projections and recesses 116 are formed to increase an effect of heat release by increasing the surface area of the base film 11a. The projections and recesses 116 comprise a metallic material and are integrated with the base film 11a. Specifically, the projections and recesses 116 can have, for example, a pattern of polka dots with a diameter of 4 mm lined up at 5 mm pitches in length and width, as illustrated in FIG. 12. The polka dots can form projections, and the surrounding can form recesses through etching or the like (described later), providing a projection and recess pattern. Alternatively, a stripe pattern, a checked pattern, or the like can also be applied.

Openings (through-holes) that penetrate in a thickness direction, such as a sprocket hole 111 and a device hole 112, are formed at predetermined sections of the base film 11a. The sprocket hole 111 is used to deliver or position the flexible circuit board 1a in a process of mounting a predetermined semiconductor element, various predetermined electronic components, and the like (hereinafter, abbreviated as "the element and the like") on the flexible circuit board 1a. The device hole 112 is a mounting opening for mounting the element and the like. The sprocket hole 111 may not be formed when the flexible circuit board 1a is delivered or positioned without using the sprocket hole 111. The device hole 112 may not be formed when a surface-mount element or the like is mounted on the flexible circuit board 1a.

The first protective film 12 is formed to cover the first surface 114 of the base film 11a. The first protective film 12 is formed by an electrically insulating material. For example, a thermoplastic polyimide film and a non-thermoplastic polyimide film are sequentially laminated, thermally compressed and attached to the base film 11a comprising a metallic material, and this organic resin layer or the like fabricated at a thickness of 3 to 10 μm can be applied as the first protective film 12. In this way, the flexible circuit board 1a according to the first embodiment of the present invention has a laminated structure of the base film 11a comprising a metallic material, the first protective film 12 made of an electrically insulating material, and the adhesive film 13 made of an electrically insulating material.

The circuit pattern 14 is a thin-film pattern formed by a conductor such as a metallic material. The circuit pattern 14 is formed by, for example, a copper film 301 (described later) with a thickness of about 8 to 50 μm. The circuit pattern 14 is adhered to the surface of the first protective film 12 by the adhesive film 13. A specific configuration of the circuit pattern 14 is appropriately set according to the circuit configuration and the like of the flexible circuit board 1a and is not particularly limited. The base film 11a that is an electrical conductor and the circuit pattern 14 are electrically insulated by the first protective film 12 and the adhesive film 13 that are electrically insulating materials.

The second protective film 15 is formed to cover the circuit pattern 14. The second protective film 15 is formed by an electrically insulating material. For example, a solder resist coating film or a coverlay film with a thickness of about 10 to 50 μm is applied as the second protective film 15. The second protective film 15 covers the circuit pattern 14 to protect the circuit pattern 14.

A predetermined part of the circuit pattern 14 is exposed without being covered by the second protective film 15. The exposed section serves as a contact pad or an inner lead. The contact pad is a section for electrically connecting the element and the like to the circuit pattern 14. The contact pad is a section that serves as a contact point (terminal) for electrically connecting the flexible circuit board 1a to an external device or the like. A nickel-plated film 141 and a gold-plated film 142 are laminated and formed on the surface of the section of the circuit pattern 14 that is exposed without being covered by the second protective film 15.

According to the configuration, the heat emitted by the element and the like mounted on the flexible circuit board 1a is diffused to the outside (for example, into the atmosphere) through the base film 11a. More specifically, the base film 11a is formed by a metallic material, and the thermal conductivity is higher than when the base film 11a is formed by a resin material. The projections and recesses 116 are formed on the second surface 115 of the base film 11a, and the surface area (area that is in contact with the atmosphere) is greater than when the projections and recesses 116 are not formed. Therefore, the effect of heat release can be increased. As a result, the increase in the temperature of the element and the like can be prevented to prevent the degradation of the characteristics, for example, when the element and the like, such as an LED in which the characteristics are degraded by heat, are mounted. Since the base film 11a is formed by a metallic material, the noise emitted by the mounted element and the like or the circuit pattern 14 is cut off. Therefore, unnecessary radiation (EMI) can be prevented or reduced.

A manufacturing method of the flexible circuit board 1a according to the first embodiment will be described with reference to FIGS. 4A to 7B. FIGS. 4A to 7B are sectional views schematically illustrating a process of a manufacturing method of the flexible circuit board 1a according to the first embodiment.

Figure 4A:
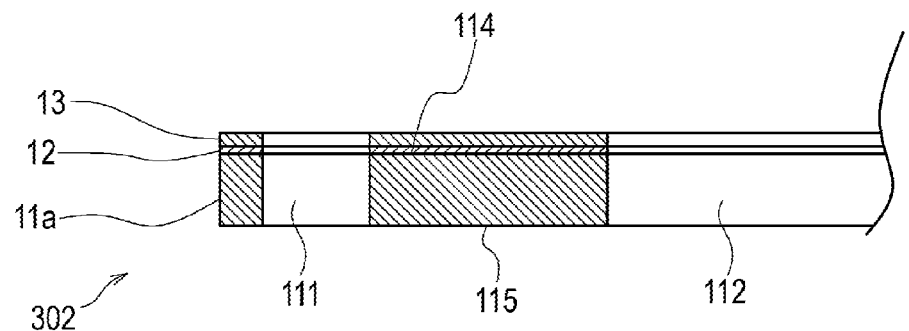
FIG. 4A is a sectional view schematically illustrating a process of a manufacturing method of the flexible circuit board according to the first embodiment.

FIG. 4A illustrates a start material 302 of the flexible circuit board 1a. As illustrated in FIG. 4A, the start material 302 is a film including the base film 11a as aluminum foil, the first protective film 12 formed on the first surface 114 of the base film 11a, and the adhesive film 13 formed on the surface of the first protective film 12. First, the sprocket hole 111 and the device hole 112 are formed on the start material 302 by punching dies. At this stage, the projections and recesses 116 are not formed on the second surface 115 (lower surface in FIG. 4A) of the base film 11a.

Figure 4B:
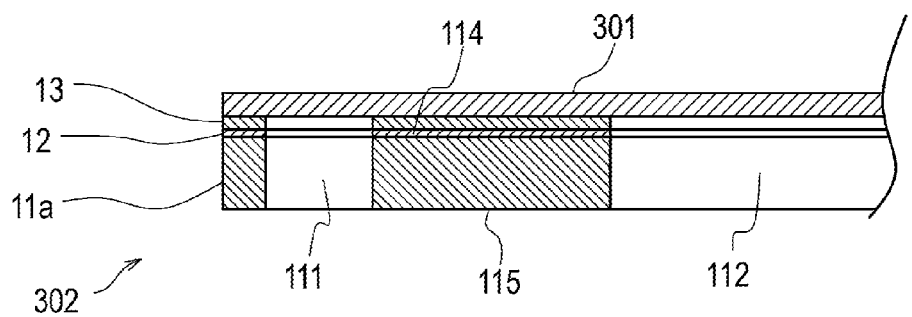
FIG. 4B is a sectional view schematically illustrating the process of the manufacturing method of the flexible circuit board according to the first embodiment.

As illustrated in FIG. 4B, the copper film 301 that is a material of the circuit pattern 14 is adhered to the adhesive film 13 (upper surface in FIG. 4B) formed on the base film 11a, through lamination or the like. More specifically, the copper film 301 is pressurized while being heated. In this way, the copper film 301 and the adhesive film 13 are closely attached, and the adhesive film 13 is cured by heat. As a result, the side of the sprocket hole 111 and the device hole 112 closer to the first surface is covered by the copper film 301.

Figure 4C:
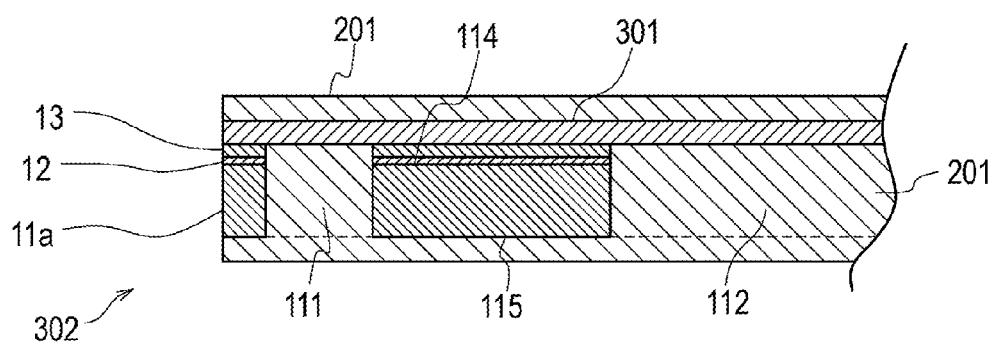
FIG. 4C is a sectional view schematically illustrating the process of the manufacturing method of the flexible circuit board according to the first embodiment.

As illustrated in FIG. 4C, a first photoresist film 201 (etching resist film) is formed to cover the surface of the adhered copper film 301. The sprocket hole 111 and the device hole 112 are further filled from the side closer to the second surface 115, and the second surface 115 is covered to form the first photoresist film 201. Although a positive photoresist is applied as the first photoresist film 201 in the configuration illustrated in FIG. 4C, a negative photoresist may be applied.

Figure 4D:
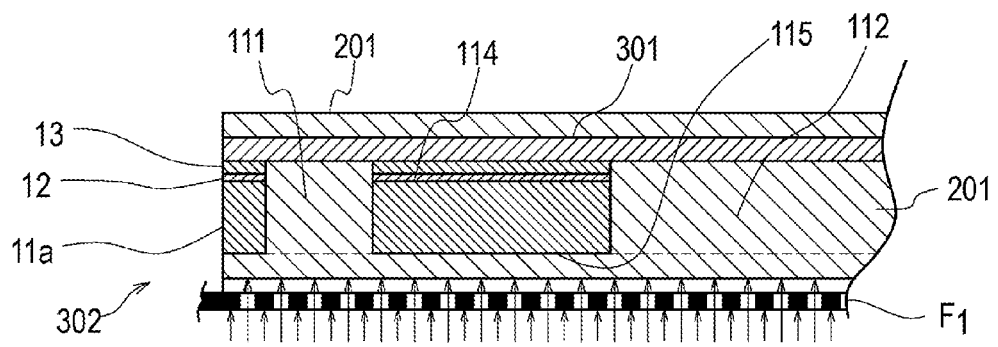
FIG. 4D is a sectional view schematically illustrating the process of the manufacturing method of the flexible circuit board according to the first embodiment.

As illustrated in FIG. 4D, exposure processing is applied to the first photoresist film 201 formed on the second surface 115 of the base film 11a. In the exposure processing, light energy at a predetermined wavelength band is applied, through a photomask $F_1$ or the like, to a predetermined area of the first photoresist film 201 formed on the second surface 115 of the base film 11a. Arrows in FIG. 4D schematically illustrate the applied light energy.

Figure 5A:
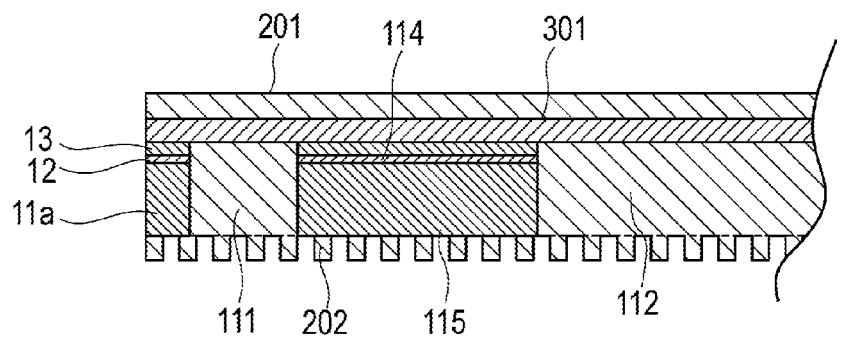
FIG. 5A is a sectional view schematically illustrating the process of the manufacturing method of the flexible circuit board according to the first embodiment.

As illustrated in FIG. 5A, development processing is applied to the first photoresist film 201 subjected to the exposure processing. In the development processing, a predetermined area of the first photoresist film 201 (section where the light energy is applied in the exposure processing if the photoresist is a positive type) is removed. Obviously, the first photoresist film 201 that fills the sprocket hole 111 and the device hole 112 is a section where the light is not applied in the exposure processing as a result of the function of the photomask $F_1$. Even after the development processing, the first photoresist film 201 firmly covers the surface of the base film 11a that serves as the backside of the copper film 301 and the inner walls of the sprocket hole 111 and the device hole 112. A first resist pattern 202 made of the first photoresist film 201 is formed on the second surface 115 of the base film 11a through the exposure processing. A predetermined area of the second surface 115 of the base film 11a is covered by the first resist pattern 202, and the remaining area is exposed without being covered by the first resist pattern 202. The adhered copper film 301 is not exposed and is still covered by the first photoresist film 201 that is not subjected to the exposure processing.

Figure 5B:
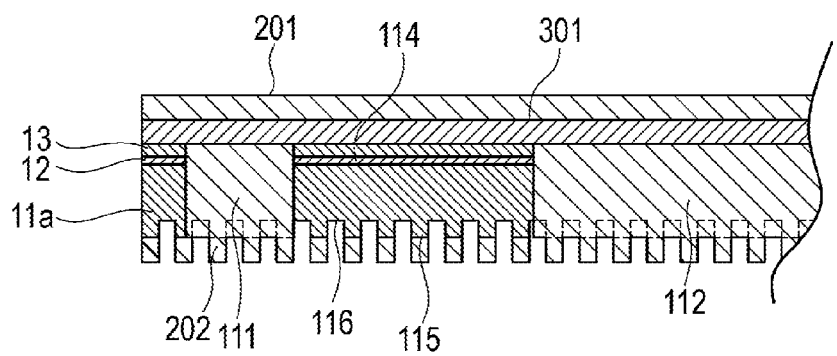
FIG. 5B is a sectional view schematically illustrating the process of the manufacturing method of the flexible circuit board according to the first embodiment.

As illustrated in FIG. 5B, the first resist pattern 202 is used as an etching mask, and the second surface 115 of the base film 11a is etched. For example, an aluminum etchant made of various well-known types of mixed acid (nitric acid, acetic acid, phosphoric acid) is applied in the etching. In this way, a section not covered by the first resist pattern 202 is etched to form a recess, and a section covered by the first resist pattern 202 is not etched and forms a projection. As a result, the projections and recesses 116 are formed on the second surface 115 of the base film 11a. The plane shape of the projections and recesses 116 (width or pitch of the projections and recesses 116) is appropriately set by the plane shape of the first resist pattern 202 (i.e. the configuration of the photomask used in the exposure processing). The depth of the projections and recesses 116 is appropriately set according to etching conditions (etching time, temperature, and the like). In the present embodiment, however, the depth is set to be about 100 μm which is about one third of the thickness of the base film 11a at the start. The copper film 301 adhered to the first surface 114 of the base film 11a through the first protective film 12 is covered and protected by the first photoresist film 201. Therefore, the copper film 301 is not etched in the process.

Figure 5C:
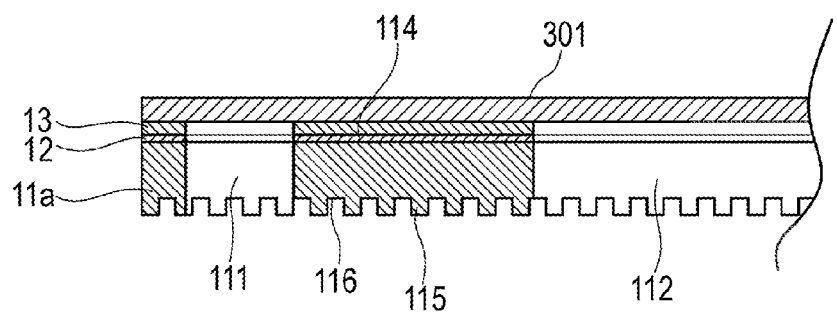
FIG. 5C is a sectional view schematically illustrating the process of the manufacturing method of the flexible circuit board according to the first embodiment.

As illustrated in FIG. 5C, the first photoresist film 201 that covers the copper film 301 and the first resist pattern 202 that covers the second surface of the base film 11a are removed. For example, caustic soda is used to remove the first photoresist film 201 and the first resist pattern 202.

Figure 5D:
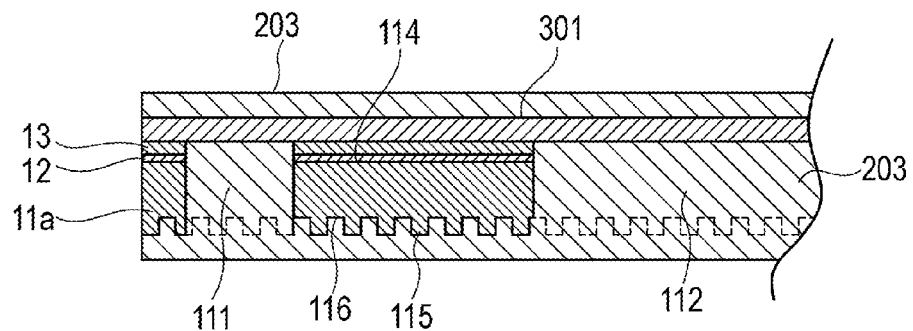
FIG. 5D is a sectional view schematically illustrating the process of the manufacturing method of the flexible circuit board according to the first embodiment.

As illustrated in FIG. 5D, a second photoresist film 203 is formed to cover the copper film 301 adhered to the adhesive film 13 formed over the base film 11a, the second surface 115 of the base film 11a, the sprocket hole 111, and the device hole 112. Although a positive photoresist is applied as the second photoresist film 203 in the configuration illustrated in FIG. 5D, a negative photoresist may be applied.

Figure 6A:
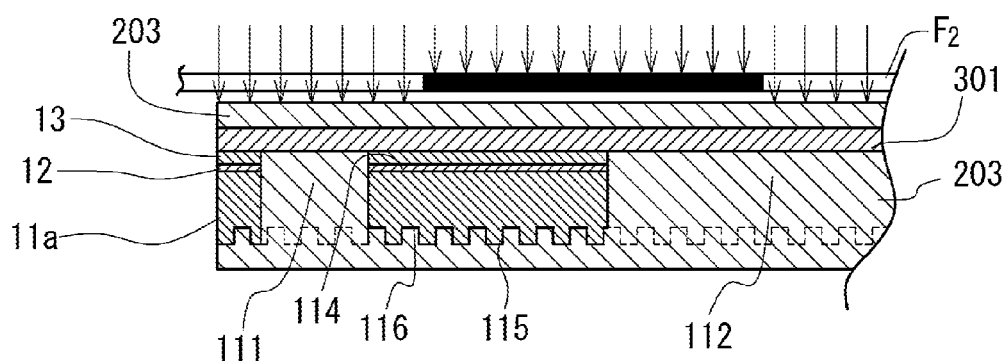
FIG. 6A is a sectional view schematically illustrating the process of the manufacturing method of the flexible circuit board according to the first embodiment.

As illustrated in FIG. 6A, exposure processing is applied to the second photoresist film 203 that covers the surface of the copper film 301. In the exposure processing, light energy at a predetermined wavelength band is applied, through a photomask $F_2$ or the like, to a predetermined area of the second photoresist film 203 that covers the copper film 301. Arrows in FIG. 6A schematically illustrate the applied light energy.

Figure 6B:
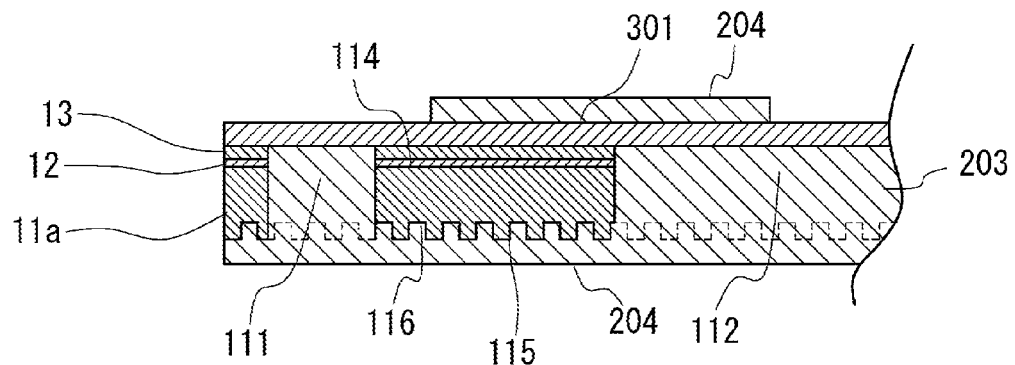
FIG. 6B is a sectional view schematically illustrating the process of the manufacturing method of the flexible circuit board according to the first embodiment.

As illustrated in FIG. 6B, development processing is applied to the second photoresist film 203 subjected to the exposure processing. For example, a sodium carbonate aqueous solution is used in the development processing. In the development processing, a predetermined area of the second photoresist film 203 (area where the light energy is applied if the second photoresist film 203 is a positive type) is dissolved in the developer and removed. As a result, a second resist pattern 204 made of the second photoresist film 203 is formed on the surface of the copper film 301. A predetermined area of the copper film 301 is covered by the second resist pattern 204, and the remaining area is exposed without being covered by the second resist pattern 204. The second surface 115 of the base film 11a, the sprocket hole 111, and the device hole 112 are not exposed and are still covered by the second photoresist film 203 that is not subjected to the exposure processing.

Figure 6C:
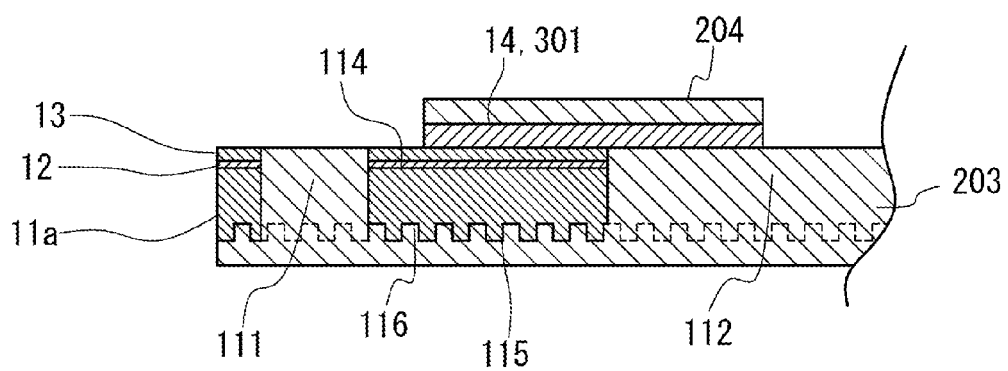
FIG. 6C is a sectional view schematically illustrating the process of the manufacturing method of the flexible circuit board according to the first embodiment.

As illustrated in FIG. 6C, the second resist pattern 204 is used as an etching mask to etch the copper film 301. The circuit pattern 14 made of the copper film 301 is formed by the etching. In the process of etching the copper film 301, the projections and recesses 116 formed on the second surface 115 of the base film 11a are covered and protected by the second photoresist film 203. Although the adhesive film 13 is exposed at the section where the copper film 301 is removed by the etching, the base film 11a is not exposed because the base film 11a is covered by the adhesive film 13. Therefore, the base film 11a is not etched in the process.

Figure 6D:
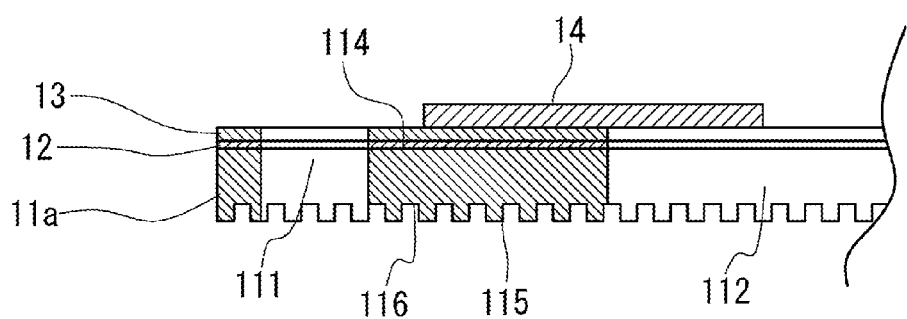
FIG. 6D is a sectional view schematically illustrating the process of the manufacturing method of the flexible circuit board according to the first embodiment.

As illustrated in FIG. 6D, the second resist pattern 204 that covers the circuit pattern 14 and the second photoresist film 203 that covers the second surface 115 of the base film 11a, the sprocket hole 111, and the device hole 112 are removed. For example, caustic soda is used to remove the second photoresist film 203 and the second resist pattern 204.

Figure 7A:
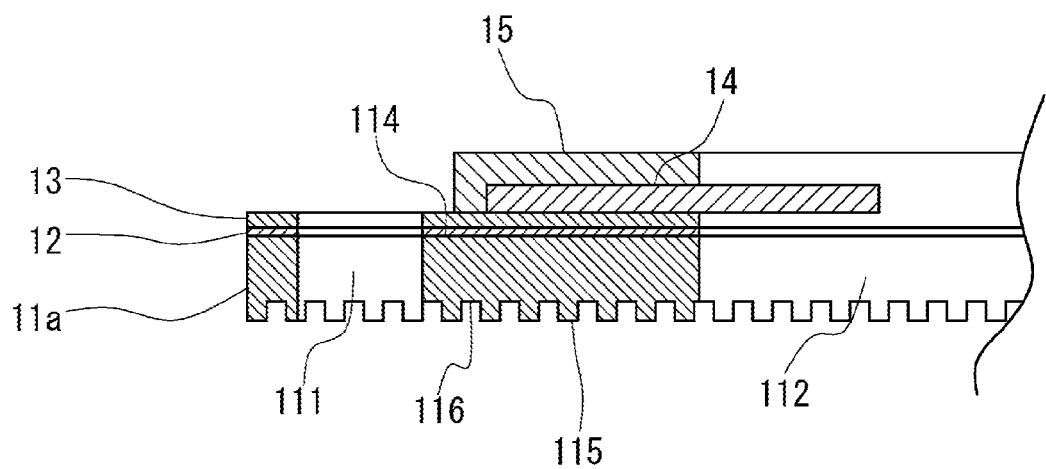
FIG. 7A is a sectional view schematically illustrating the process of the manufacturing method of the flexible circuit board according to the first embodiment.

As illustrated in FIG. 7A, the second protective film 15 is formed to cover a predetermined section of the circuit pattern 14. For example, a method of applying a solder resist ink for thermal curing in screen printing or a method of heating and laminating a coverlay film that is cut in advance in a predetermined shape is applied as a method of forming the second protective film 15.

Figure 7B:
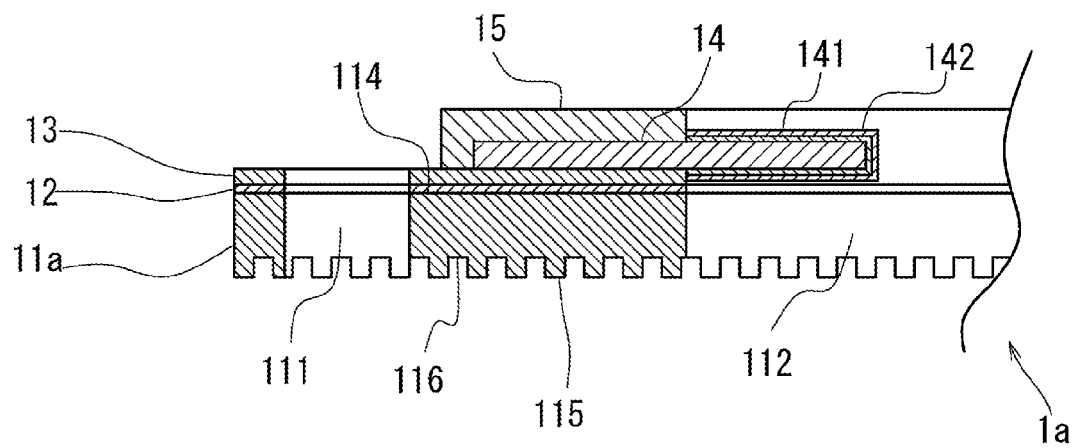
FIG. 7B is a sectional view schematically illustrating the process of the manufacturing method of the flexible circuit board according to the first embodiment.

As illustrated in FIG. 7B, the nickel-plated film 141 is formed at a section that serves as an inner lead or a contact pad in the circuit pattern 14 (section not covered by the second protective film 15). The gold-plated film 142 is further formed on the surface of the nickel-plated film 141.

The flexible circuit board 1a according to the first embodiment of the present invention is manufactured through the foregoing process.

In this way, the projections and recesses 116 for heat release are formed on the second surface 115 of the base film 11a. According to the configuration, the effect of heat release of the circuit pattern 14 and the mounted element and the like can be increased without increasing the number of components or the assembly time. The base film 11a is formed by a metallic material that is a conductive material. Therefore, unnecessary radiation emitted by the mounted element and the like and the circuit pattern 14 can be cut off. Therefore, the unnecessary radiation from the flexible circuit board 1a can be prevented or reduced.

Second Embodiment

Figure 8:
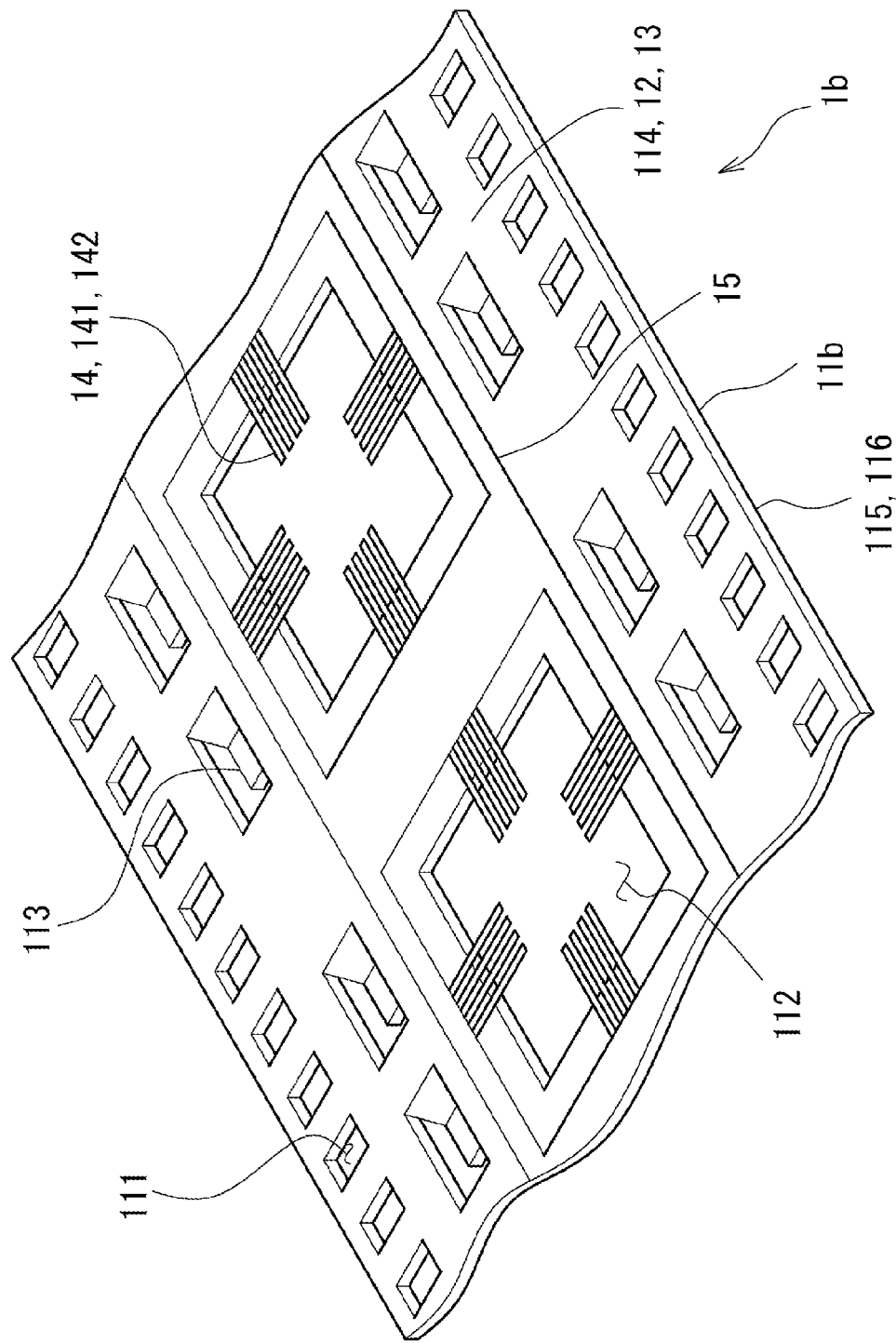
FIG. 8 is a perspective view schematically illustrating a configuration of a flexible circuit board according to a second embodiment of the present invention.
Figure 9:
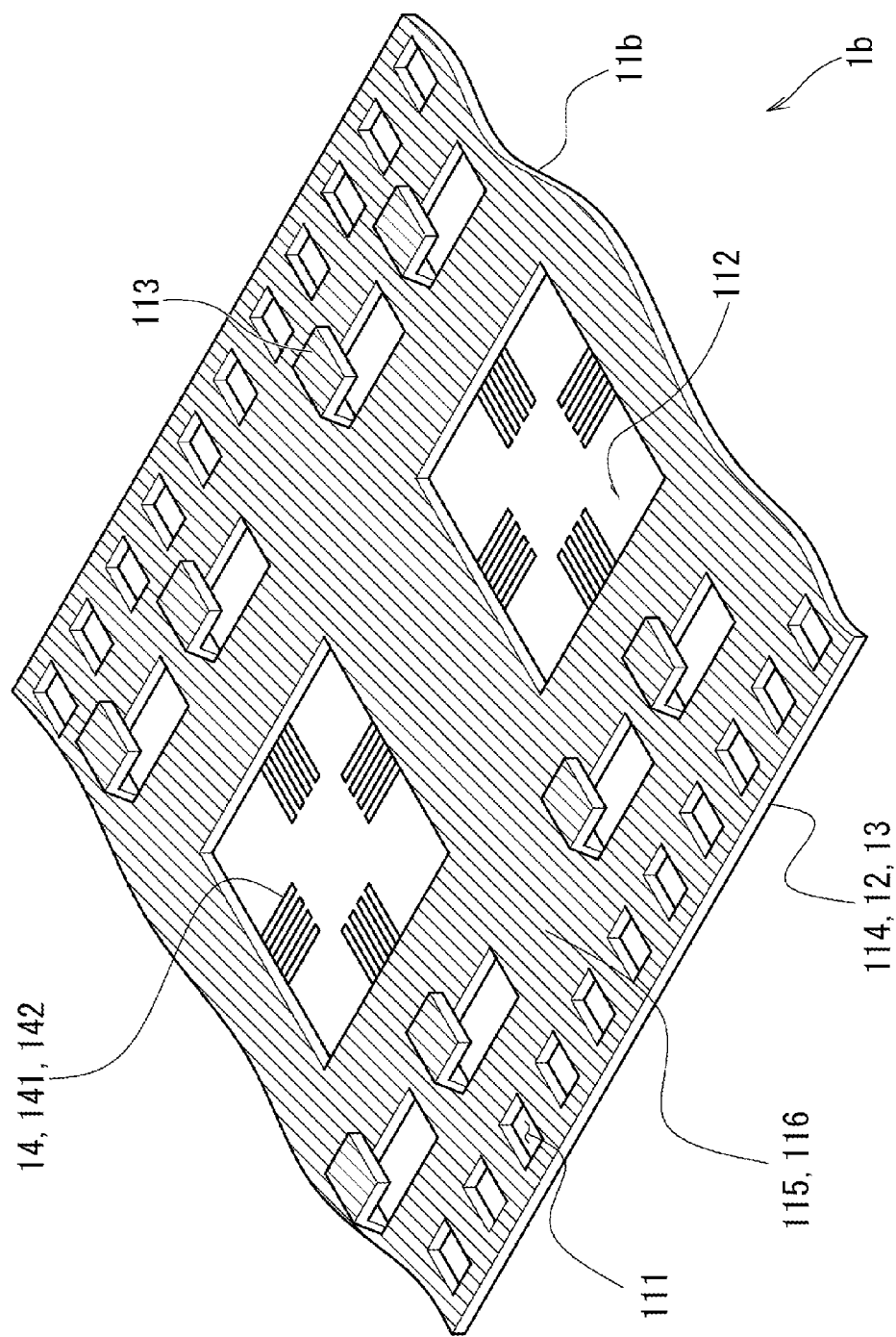
FIG. 9 is a perspective view schematically illustrating the configuration of the flexible circuit board according to the second embodiment of the present invention.
Figure 10:
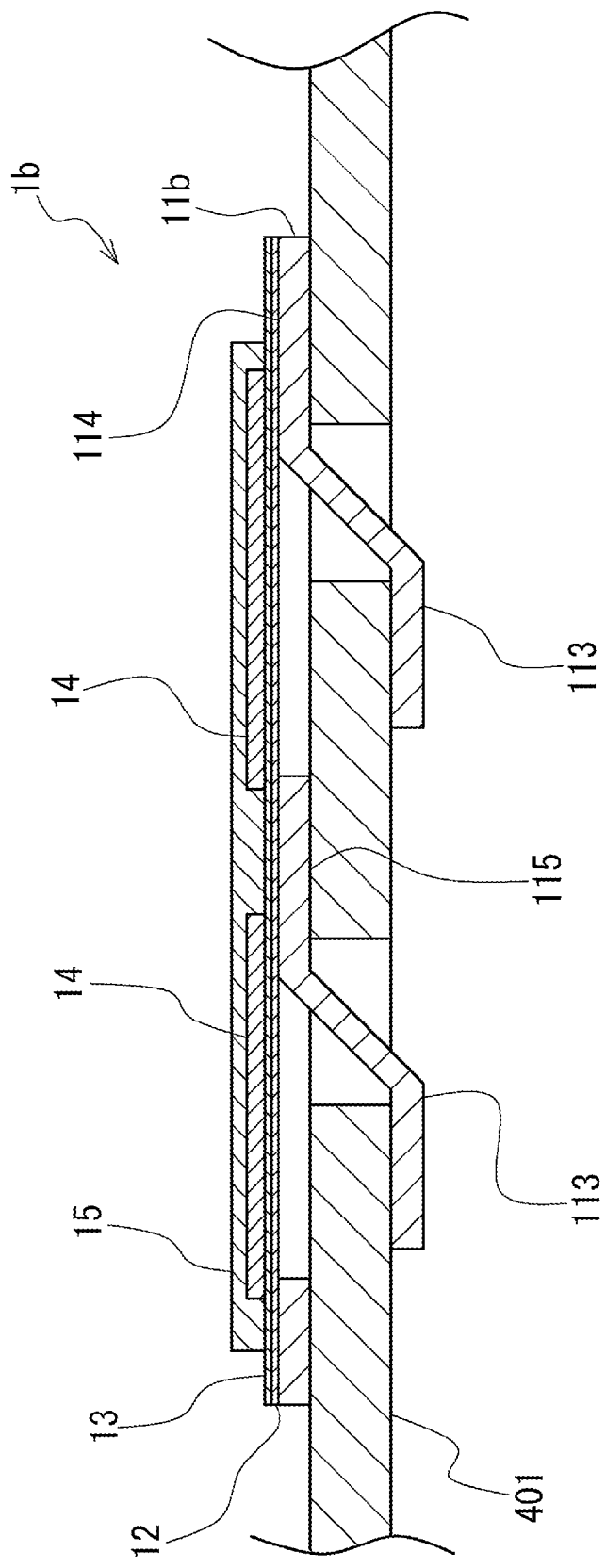
FIG. 10 is a sectional view schematically illustrating a state that the flexible circuit board according to the second embodiment of the present invention is attached to another member.

A flexible circuit board 1b according to a second embodiment of the present invention will be described with reference to FIGS. 8 to 10. FIGS. 8 and 9 are perspective views schematically illustrating a configuration of the flexible circuit board 1b according to the second embodiment of the present invention. FIGS. 8 and 9 illustrate views as seen from opposite sides. FIG. 10 is a sectional view schematically illustrating that the flexible circuit board 1b according to the second embodiment of the present invention is attached to another member 401. The same parts as those of the flexible circuit board 1a according to the first embodiment are designated with the same reference numerals, and the descriptions will not be repeated.

The flexible circuit board 1b according to the second embodiment of the present invention includes a base film 11b, the first protective film 12, the adhesive film 13, the circuit pattern 14, and the second protective film 15.

Metal foil is applied as the base film 11b. The metal foil is made of, for example, one of copper, iron, nickel, chromium, molybdenum, and aluminum or made of an alloy including one of these as a principal component. Alternatively, stainless foil can be applied as the metal foil.

The projections and recesses 116 may be formed on the second surface 115 of the base film 11b as in the first embodiment, or the projections and recesses 116 may not be formed. A locking piece 113 for attaching the flexible circuit board 1b to the other member 401 is integrated with the base film 11b. Examples of the other member 401 include a housing, a frame and the like of an apparatus in which the flexible circuit board 1b is used. The locking piece 113 is elastically deformable and is bent upright to protrude toward the second surface 115 of the base film 11b. The locking piece 113 has a tongue-like structure. An example of a method of forming the locking piece 113 includes a method of forming a substantially U-shaped slit on the base film 11b by press working and bending the piece upright toward the second surface 115 to cause the piece to protrude. According to the configuration, the locking piece 113 protruding toward the second surface 115 can be integrated with the base film 11b.

The first protective film 12, the adhesive film 13, the circuit pattern 14, and the second protective film 15 can have the same configurations as those of the first embodiment. Therefore, the descriptions will not be repeated. The locking piece 113 can be arranged at a position without the circuit pattern 14 in the surrounding, and the base film 11b can be prepared in which the first protective film 12 and the adhesive film 13 are not formed at the locking piece 113 and around the locking piece 113. In this case too, it is obvious that the base film 11b is electrically insulated from the circuit pattern 14 by the first protective film 12 and the adhesive film 13 as can be recognized from FIG. 10.

A configuration of attaching the flexible circuit board 1b to the other member 401 will be described with reference to FIG. 10. As illustrated in FIG. 10, the locking piece 113 is elastically deformed, and the other member 401 is placed between the second surface 115 of the base film 11b and the first surface 114 on the side of the locking piece 113. Consequently, the flexible circuit board 1b is attached to the other member 401. The second surface 115 of the base film 11b and the other member 401 come in direct contact with each other, and the second surface 115 of the base film 11b is closely attached to the surface of the other member 401 by the elastic force of the locking piece 113. According to the configuration, the heat emitted by the element and the like is easily transmitted to the other member 401 through the base film 11b. Therefore, an effect of cooling the element and the like and the flexible circuit board 1b can be increased.

Conventionally, for example, an adhesive, a double-sided tape, or a screw is used to attach the flexible circuit board to the other member. However, the flexible circuit board and the other member do not come in direct contact with each other when the adhesive or the double-sided tape is used. Therefore, the thermal conductivity between the flexible circuit board and the other member is reduced. A hole for fastening the screw (such as a screw hole) needs to be formed on the other member when the screw is used. Furthermore, it is difficult to closely attach the entire flexible circuit board to the other member when the screw is used. Therefore, the effect of heat release is low in the conventional configurations.

On the other hand, the second surface 115 of the base film 11b and the other member 401 can come in direct contact with each other according to the flexible circuit board 1b of the second embodiment of the present invention. Therefore, the thermal conductivity between the flexible circuit board 1b and the other member 401 can be improved (or the reduction can be prevented), as compared to when the adhesive or the double-sided tape is used. If the locking piece 113 is elastically deformable, the elastic force of the locking piece 113 can maintain the close attachment of the second surface 115 of the base film 11b with the other member 401.

In this way, according to the flexible circuit board 1b of the second embodiment of the present invention, the same effect as that of the flexible circuit board 1a of the first embodiment can be attained. According to the flexible circuit board 1b of the second embodiment of the present invention, the thermal conductivity between the base film 11b of the flexible circuit board 1b and the other member 401 can be improved. Therefore, the effect of cooling the element and the like can be improved.

The manufacturing method of the flexible circuit board 1b according to the second embodiment of the present invention includes the process of forming the locking piece 113 in addition to the manufacturing method of the flexible circuit board 1a according to the first embodiment. The method of forming the locking piece 113 is as described above. The process for forming the projections and recesses 116 is omitted when the projections and recesses 116 are not formed on the second surface 115 of the base film 11b. Therefore, the description of the manufacturing method of the flexible circuit board 1b according to the second embodiment of the present invention will not be repeated.

Third Embodiment

Figure 11:
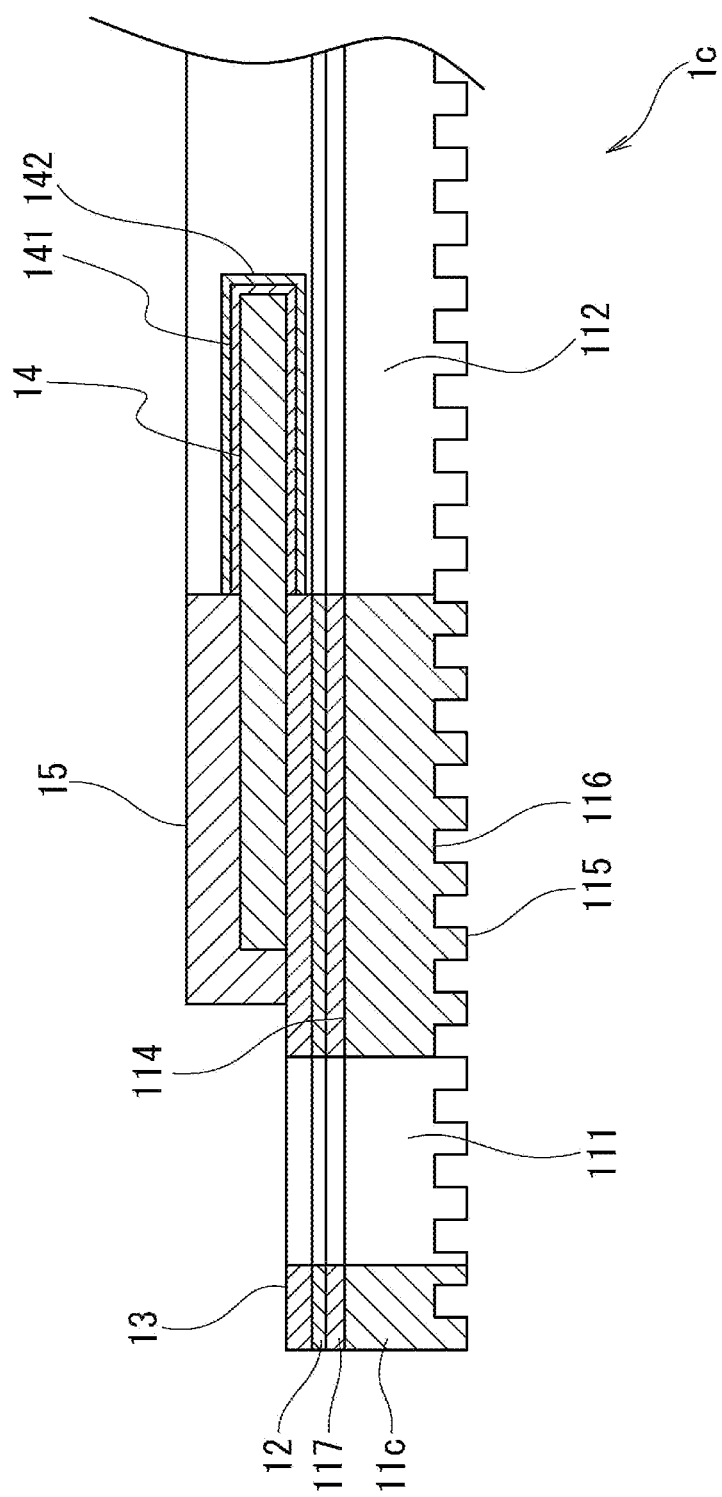
FIG. 11 is a sectional view schematically illustrating a configuration of a flexible circuit board according to a third embodiment of the present invention.

A flexible circuit board 1c according to a third embodiment of the present invention will be described with reference to FIG. 11. FIG. 11 is a sectional view schematically illustrating a configuration of the flexible circuit board 1c according to the third embodiment of the present invention. The same parts as those of the flexible circuit board 1a according to the first embodiment of the present invention are designated with the same reference numerals, and the descriptions will not be repeated.

As illustrated in FIG. 11, the flexible circuit board 1c includes a base film 11c, the first protective film 12, the adhesive film 13, the circuit pattern 14, and the second protective film 15.

The base film 11c is a flexible film formed by a metallic material. An oxide film 117 is formed on the first surface 114 of the base film 11c. The oxide film 117 is an electrically insulating substance. The oxide film 117 may be or may not be formed on the second surface 115. It is only necessary that the oxide film 117 be formed at least on the first surface 114 that is one of the surfaces. When the metallic material of the base film 11c is made of aluminum, an oxide film formed by alumite treatment can be applied to this embodiment.

The base film 11c can have the same configuration as that of the first embodiment, except that the electrically insulating oxide film 117 is formed on the first surface 114. The first protective film 12, the adhesive film 13, the circuit pattern 14, and the second protective film 15 can have the same configurations as those of the first embodiment.

In this way, the oxide film 117 and the first protective film 12 that are electrically insulating materials (having insulation properties) exist between the base film 11c and the circuit pattern 14 formed by electrical conductors. Therefore, the electrical insulation performance between the circuit pattern 14 and the base film 11c can be improved.

More specifically, in the configuration where the circuit pattern 14 is adhered to the first protective film 12 by the adhesive film 13, a coarsening process is applied in advance to the surface of the copper film 301 that is a material of the circuit pattern 14 to improve the adhesive strength of the circuit pattern 14 and the adhesive film 13. Minute projections and recesses are formed on the surface of the copper film 301 by the coarsening process. Therefore, the projections of the projections and recesses formed on the circuit pattern 14 (the copper film 301) may penetrate through the adhesive film 13 to come in contact with the first protective film 12. In this way, the adhesive film 13 may not be able to secure the electrical insulation of the circuit pattern 14 and the base film 11c. Therefore, the electrical insulation of the circuit pattern 14 and the base film 11c is secured by the first protective film 12. Lamination is used as a method of bonding the copper film 301 that is a material of the circuit pattern 14 to the first protective film 12. In the lamination, the copper film 301 is bonded while the copper film 301 is pressurized. Therefore, the pressure may cause minute protrusions on the surface of the copper film 301 to penetrate through the first protective film 12 to come in contact with the base film 11c. As a result, the circuit pattern 14 (the copper film 301) and the base film 11c may be electrically short-circuited if there is only the first protective film 12.

In the third embodiment of the present invention, the electrically insulating oxide film 117 is formed on the first surface 114 of the base film 11c. Therefore, the electrical insulation of the circuit pattern 14 and the base film 11c is secured by the first protective film 12 and the oxide film 117 existing between the circuit pattern 14 and the base film 11c. More specifically, the insulation performance of the oxide film 117 and the first protective film 12 determines the electrical insulation performance of the circuit pattern 14 and the base film 11c.

According to the flexible circuit board 1c of the third embodiment, the same effect as that of the flexible circuit board 1a of the first embodiment can be attained. According to the configuration, the electrical insulation performance of the circuit pattern 14 and the base film 11c can be improved, as compared to when the oxide film 117 is not formed on the first surface 114 of the base film 11c.

The same method as that of the first embodiment can be applied as the manufacturing method of the flexible circuit board 1c according to the third embodiment, except that the start material is different. A film, which includes the base film 11c in which the oxide film 117 is formed on the first surface 114, the first protective film 12 formed on the surface of the oxide film 117, and the adhesive film 13 formed on the surface of the first protective film 12, is used as the start material. The start material is used to manufacture the flexible circuit board 1c according to the third embodiment by the same manufacturing method as that of the first embodiment.

Meanwhile, the application to the second embodiment is also easily possible, in which the base film including the oxide film 117 formed on the first surface 114 is used as the start material. Particularly, the oxide film based on the alumite treatment is extremely thin, and the oxide film can be about 10 μm. Therefore, the influence of the processability and the elasticity of the locking piece according to the second embodiment, the thermal conductivity of the base film, and the like is negligible. The application can attain the same effect as that of the second embodiment.

Although various embodiments (various examples) of the present invention have been described in detail with reference to the drawings, the present invention is not limited to the embodiments (examples) in any sense. Various modifications can be made without departing from the scope of the present invention. For example, although the configuration illustrated in the embodiments includes a predetermined single-layer wiring pattern, a predetermined multi-layer wiring pattern may be included.

The present invention can be used for a flexible circuit board including a base film formed by a metallic material. According to the present invention, the heat of the circuit pattern, the mounted element, and the like can be released without increasing the number of components and the assembly time, and unnecessary radiation can be prevented.

Although a flexible circuit board for TAB has been illustrated in the embodiments (examples), the present invention can also be applied to a flexible circuit board other than the flexible circuit board for TAB. Although a flexible circuit board has been illustrated in the embodiments, the present invention can also be applied to a circuit board without flexibility (so-called rigid circuit board).

According to the present invention, the projections and recesses for heat release are formed on the other surface of the base film. Therefore, the effect of releasing the heat of the circuit pattern, the mounted element, and the like can be increased without increasing the number of components and the assembly time. The base film is formed by a metallic material that is a conductive material. Therefore, unnecessary radiation emitted by the mounted element and the like or the circuit pattern can be cut off. As a result, the unnecessary radiation from the flexible circuit board can be prevented or reduced.

What is claimed is:

1. A flexible circuit board comprising:
    a base film that is flexible and made of a metallic material;
    a first protective film made of an electrically insulating material and disposed on a first side of the base film; and
    a circuit pattern arranged on a surface of the first protective film,
    wherein base film has a plurality of projections and recesses running continuously along substantially an entire length of a second side thereof, which is opposite the first side.

2. The flexible circuit board according to claim 1, wherein the plurality of projections and recesses form a pattern of polka dots with a diameter of 4 units lined up at 5 units in pitch in length and width.

3. The flexible circuit board according to claim 1, wherein the plurality of projections are arranged two-dimensionally, and an area ratio between the projections and the recesses in plan view is substantially the same.

4. The flexible circuit board according to claim 1, further comprising:
    an alumite treated film,
    wherein the metallic material is made of an aluminum film, and the alumite treated film is disposed on a surface of the aluminum film.

5. The flexible circuit board according to claim 1, wherein the circuit pattern is adhered to the first protective film with an adhesive film made of an insulating material laminated on the first side of the first protective film.

6. A flexible circuit board comprising:
    a base film that is flexible and made of a metallic material;
    a first protective film made of an electrically insulating material and disposed on a first side of the base film; and
    a circuit pattern disposed on a surface of the protective film,
    wherein the base film has at least one locking member that is configured to attach the flexible circuit board to another member, and
    wherein the locking member is elastically deformable and protrudes outwardly from a second side, which is opposite the first side, of the base film.

7. The flexible circuit board according to claim 6, wherein the locking member is integrated with the base film.

8. The flexible circuit board according to claim 6, further comprising:
    an electrically insulating oxide film disposed on the first side of the base film,
    wherein the first protective film is disposed on a surface of the electrically insulating oxide film, and
    the electrically insulating oxide film and the first protective film exist between the circuit pattern and the base film.

9. The flexible circuit board according to claim 8, wherein the metallic material is made of aluminum, and the electrically insulating oxide film is an alumite treated oxide film.

10. The flexible circuit board according to claim 6, wherein the base film has a slit and the locking member extends outwardly from one end side of the slit and has a bent segment disposed over the slit.

11. The flexible circuit board according to claim 6, wherein the locking member is elastically deformable and is configured to hold the flexible circuit board to the another member via an elastic force of the locking member from the second side of the base film.

12. A flexible circuit board comprising:
    a base film that is flexible and made of a metallic material;
    a first protective film made of an electrically insulating material and disposed on a first side of the base film; and
    a circuit pattern disposed on a surface of the protective film,
    wherein the base film has:
        at least one locking member that is configured to attach the flexible circuit board to another member, wherein the locking member is elastically deformable and protrudes outwardly from a second side, which is opposite the first side, of the base film; and
    a plurality of projections and recesses disposed on the second side of the base film.

13. The flexible circuit board according to claim 12, wherein the locking-member is integrated with the base film.

14. The flexible circuit board according to claim 12, further comprising:
   an electrically insulating oxide film disposed on the first side of the base film,
   wherein the first protective film is disposed on a surface of the electrically insulating oxide film, and
   wherein the electrically insulating oxide film and the first protective film exist between the circuit pattern and the base film.

15. The flexible circuit board according to claim 14, wherein the metallic material is made of aluminum, and the electrically insulating oxide film is an alumite treated oxide film.

16. The flexible circuit board according to claim 12, wherein the base film has a slit and the locking member extends outwardly from one end side of the slit and has a bent segment disposed over the slit.

17. The flexible circuit board according to claim 12, wherein the locking member is elastically deformable and is configured to hold the flexible circuit board to the another member via an elastic force of the locking member from the second side of the base film.

18. The flexible circuit board according to claim 12, wherein the plurality of projections and recesses form a pattern of polka dots with a diameter of 4 units lined up at 5 units in pitches in length and width.

19. The flexible circuit board according to claim 12, wherein the plurality of projections are arranged two-dimensionally, and an area ratio between the projections and the recesses in plan view is substantially the same.

* * * * *